US012580009B2

(12) United States Patent
Cai et al.

(10) Patent No.: US 12,580,009 B2
(45) Date of Patent: Mar. 17, 2026

(54) COMPUTE-IN-MEMORY CIRCUIT BASED ON CHARGE REDISTRIBUTION, AND CONTROL METHOD THEREOF

(71) Applicant: Peking University, Beijing (CN)

(72) Inventors: Yimao Cai, Beijing (CN); Zongwei Wang, Beijing (CN); Yunfan Yang, Beijing (CN); Ru Huang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 63 days.

(21) Appl. No.: 18/666,427

(22) Filed: May 16, 2024

(65) Prior Publication Data

US 2024/0386922 A1 Nov. 21, 2024

(30) Foreign Application Priority Data

May 17, 2023 (CN) .......................... 202310555036.5

(51) Int. Cl.
*G11C 7/10* (2006.01)
*G11C 7/12* (2006.01)

(52) U.S. Cl.
CPC ............ *G11C 7/106* (2013.01); *G11C 7/1063* (2013.01); *G11C 7/12* (2013.01)

(58) Field of Classification Search
CPC .......... G11C 7/12; G11C 7/106; G11C 7/1063
USPC .................................................... 365/189.17
See application file for complete search history.

(56) References Cited

U.S. PATENT DOCUMENTS

| 12,106,804 | B2 * | 10/2024 | Gopinath | ........... | G11C 13/0069 |
| 12,125,530 | B2 * | 10/2024 | Gopinath | ........... | G11C 13/0028 |
| 12,136,468 | B2 * | 11/2024 | Gopinath | ............ | G11C 7/1039 |
| 12,159,685 | B2 * | 12/2024 | Gopinath | ............... | G11C 11/54 |

(Continued)

FOREIGN PATENT DOCUMENTS

| CN | 101859602 A | 10/2010 |
| CN | 102882509 A | 1/2013 |

(Continued)

OTHER PUBLICATIONS

Notification to Grant Patent Right for Invention in related Chinese Application No. 202310555036, issued Mar. 5, 2024, 3 pages.

(Continued)

*Primary Examiner* — Sung Il Cho
(74) *Attorney, Agent, or Firm* — GREENBLUM & BERNSTEIN, P.L.C.

(57) ABSTRACT

A compute-in-memory circuit based on charge redistribution includes a memory array, multiple-functional output units (MFUs), multiplexers (MUXs), and a word line (WL) driver. The memory array includes memory cell rows and memory cell columns. Every two adjacent memory cells form a memory cell pair in sequence, and every two adjacent memory cell columns form a memory cell column pair in sequence. A grounded register capacitor is connected to a source line (SL) of each memory cell row. Input ends of each MFU are connected to a first bit line (BL) and a second BL of each memory cell column pair, respectively. Each MUX includes voltage-input ends and an output end, and the output end of each MUX is connected to the SL of each memory cell row in a one-to-one correspondence. An output end of the WL driver is connected to a WL of each memory cell row.

13 Claims, 10 Drawing Sheets

(56)     References Cited

U.S. PATENT DOCUMENTS

| | | | |
|---|---|---|---|
| 2019/0057727 A1 | 2/2019 | Mathuriya et al. | |
| 2020/0382066 A1* | 12/2020 | Khlat ................... | H03F 1/0233 |
| 2021/0280239 A1 | 9/2021 | Tran et al. | |
| 2022/0108742 A1 | 4/2022 | Li et al. | |
| 2024/0119974 A1* | 4/2024 | Gopinath ................. | G11C 7/12 |
| 2024/0119975 A1* | 4/2024 | Gopinath ............... | G06N 3/065 |
| 2024/0120001 A1* | 4/2024 | Gopinath ........... | G11C 13/0026 |

FOREIGN PATENT DOCUMENTS

| | | | |
|---|---|---|---|
| CN | 112581996 A | 3/2021 | |
| CN | 114816330 A | 7/2022 | |
| CN | 115906976 A | 4/2023 | |
| EP | 0078608 A2 | 5/1983 | |
| GB | 2583121 A | 10/2020 | |
| JP | 2007299456 A | 11/2007 | |
| WO | 2020177202 A1 | 9/2020 | |

OTHER PUBLICATIONS

First Office Action in related Chinese Application No. 202310555036, issued Feb. 8, 2024, 12 pages.

* cited by examiner

DAC or
Buffer

TIA

Precharge
voltage

Loss of
charge

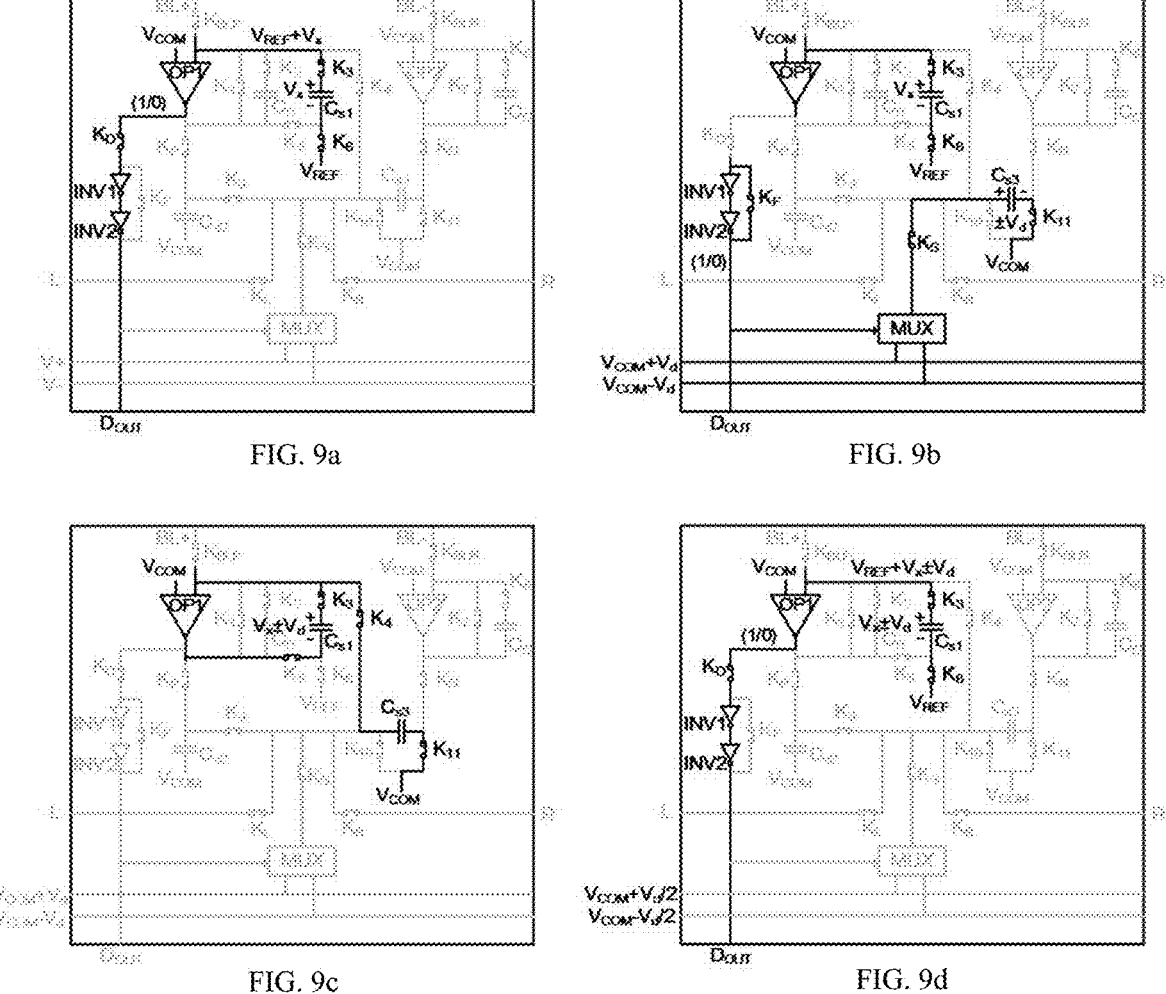
FIG. 9a                    FIG. 9b
FIG. 9c                    FIG. 9d

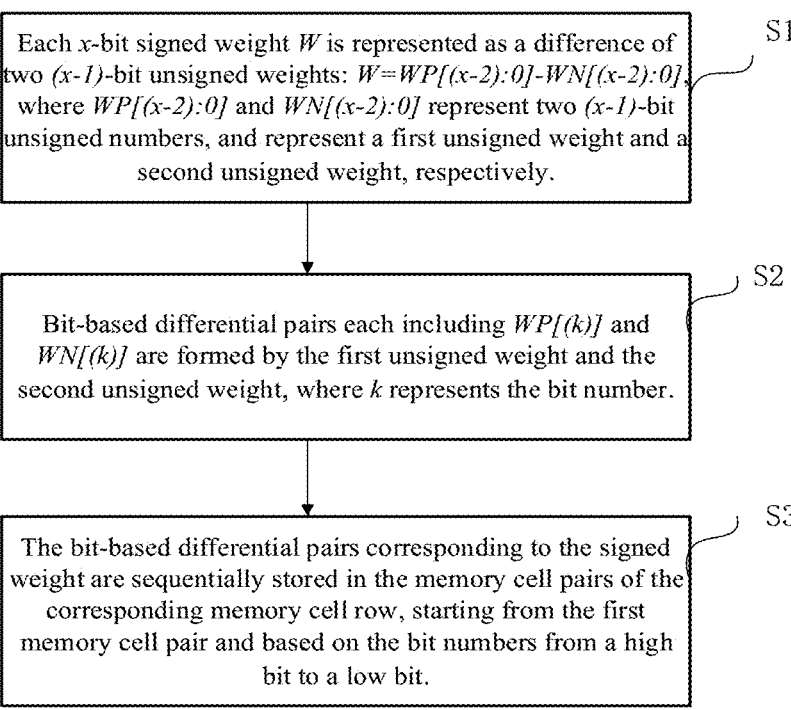

Each $x$-bit signed weight $W$ is represented as a difference of two $(x-1)$-bit unsigned weights: $W = WP[(x-2):0] - WN[(x-2):0]$, where $WP[(x-2):0]$ and $WN[(x-2):0]$ represent two $(x-1)$-bit unsigned numbers, and represent a first unsigned weight and a second unsigned weight, respectively.

S1

Bit-based differential pairs each including $WP[(k)]$ and $WN[(k)]$ are formed by the first unsigned weight and the second unsigned weight, where $k$ represents the bit number.

S2

The bit-based differential pairs corresponding to the signed weight are sequentially stored in the memory cell pairs of the corresponding memory cell row, starting from the first memory cell pair and based on the bit numbers from a high bit to a low bit.

COMPUTE-IN-MEMORY CIRCUIT BASED ON CHARGE REDISTRIBUTION, AND CONTROL METHOD THEREOF

CROSS-REFERENCE TO RELATED APPLICATION

The present application claims the priority of Chinese patent application No. 202310555036.5, filed on May 17, 2023, and entitled "COMPUTE-IN-MEMORY CIRCUIT BASED ON CHARGE REDISTRIBUTION", which is incorporated herein by reference in its entirety.

TECHNICAL FIELD

The present application belongs to the technical fields of non-volatile memories and Compute-In-Memory (CIM) in semiconductor and in CMOS Ultra Large-Scale Integration (ULSI).

BACKGROUND

With the development of artificial intelligence and deep learning technology, artificial neural networks have been widely used in fields such as natural language processing, image recognition, autonomous driving, and graph neural networks. However, the increasing size of the network causes a consumption of large amount of energy during a transfer of data between the memory and the traditional processing device such as CPU or GPU, which is known as the von Neumann bottleneck. The computation that occupies the most significant part of the artificial neural network algorithm is the vector matrix multiplication. In the CIM based on non-volatile memory, weights are stored in non-volatile memory cells, and the analog-vector matrix multiplication is processed in the memory array, which avoids the frequent transfers of data between the memory and the processing unit, and is considered to be a promising solution to the problem of the von Neumann bottleneck.

SUMMARY

The present disclosure provides a compute-in-memory (CIM) circuit based on charge redistribution, including: a memory array, a plurality of multiple-functional output units (MFUs), a plurality of multiplexers (MUXs), and a word line (WL) driver. The memory array includes a plurality of memory cell rows and a plurality of memory cell columns. Each memory cell row includes a plurality of memory cells. Each memory cell column includes a plurality of memory cells. Starting from a first memory cell in each memory cell row, every two adjacent memory cells form a memory cell pair in sequence, and starting from a first memory cell column in the memory array, every two adjacent memory cell columns form a memory cell column pair in sequence. A grounded register capacitor is connected to a source line (SL) of each memory cell row. Input ends of each of the plurality of MFUs are connected to a first bit line (BL) and a second BL of each memory cell column pair, respectively. Each of the plurality of MUXs includes a plurality of voltage-input ends and an output end, and the output end of each of the MUXs is connected to the SL of each memory cell row in a one-to-one correspondence. An output end of the WL driver is connected to a WL of each memory cell row.

In an embodiment of the present disclosure, the CIM circuit based on charge redistribution further includes a low dropout regulator (LDO) and an input register. The plurality of voltage-input ends of each of the plurality of MUXs are connected to output ends of the LDO and output ends of the input register respectively.

In an embodiment of the present disclosure, the plurality of MUXs are connected in series.

In an embodiment of the present disclosure, the plurality of memory cells are RRAM, PCRAM, MRAM, FeRAM, or FeFET non-volatile memory cells.

In an embodiment of the present disclosure, the CIM circuit further includes a reference voltage generator. Output ends of the reference voltage generator are connected to a common-mode voltage terminal of each MFU, a reference voltage terminal and differential voltage ends of each MFU, respectively.

In an embodiment of the present disclosure, the reference voltage generator includes a plurality of LDOs and a plurality of digital-to-analog converters (DACs). Output ends of the plurality of LDOs are connected to the common-mode voltage terminal and the reference voltage terminal of each of the plurality of MFUs. Output ends of the plurality of DACs are connected to the differential voltage ends of each of the plurality of MFUs, respectively.

In an embodiment of the present disclosure, each of the plurality of MFUs includes a first operational amplifier and a second operational amplifier. An inverting input terminal of the first operational amplifier is connected to the first BL of a corresponding memory cell column pair through a first bit-line switch. An output terminal of the first operational amplifier is connected to a first output switch and a second capacitor connected in series. A second switch and a first clamp capacitor are connected in series in a feedback loop of the first operational amplifier. An inverting input terminal of the second operational amplifier is connected to the second BL of the corresponding memory cell column pair through a second bit-line switch. A positive input terminal of the second operational amplifier is connected to a common-mode voltage terminal; an output terminal of the second operational amplifier is connected to a second output switch, a third capacitor, and a tenth switch connected in sequence in series, and an eighth switch and a second clamp capacitor are connected in series in a feedback loop of the second operational amplifier.

In an embodiment of the present disclosure, positive input terminal of the first operational amplifier and the positive input terminal of the second operational amplifier are both connected to the common-mode voltage terminal. A first plate of the second capacitor is connected to the first output switch, and a second plate of the second capacitor is connected to the common-mode voltage terminal. A second plate of the third capacitor is connected to the second output switch, and a first plate of the third capacitor is connected to the common-mode voltage terminal through the tenth switch.

In an embodiment of the present disclosure, capacitance of the first clamp capacitor is equal to capacitance of the second clamp capacitor, and capacitance of the second capacitor is equal to capacitance of the third capacitor.

In an embodiment of the present disclosure, the feedback loop of the first operational amplifier is connected in parallel with a first switch, and further connected in parallel with a third switch, a first capacitor, and a fifth switch connected in series. The feedback loop of the second operational amplifier is further connected in parallel with a seventh switch. A fourth switch is connected between the inverting input terminal of the first operational amplifier and the first plate of the third capacitor. A ninth switch is connected between the first plate of the second capacitor and the first plate of the third capacitor. An eleventh switch is connected between the second plate of the third capacitor and the common-mode voltage terminal.

In an embodiment of the present disclosure, the first plate of the third capacitor of each MFU is connected to a first terminal of a first shift switch and a first terminal of a second shift switch. In each two adjacent MFUs, a second terminal of a second shift switch in an MFU connected to a front memory cell column pair is connected to a second terminal of a first shift switch in an MFU connected to a back memory cell column pair.

In an embodiment of the present disclosure, each of the plurality of MFUs further includes a latching circuit, and the output end of the first operational amplifier is connected to the latching circuit. A third switch, a first capacitor and a fifth switch are connected in series between the inverting input terminal and the output end of the first operational amplifier, and one end of the sixth switch is connected between the first capacitor and the fifth switch, and another end of the sixth switch is connected to the reference voltage terminal.

In an embodiment of the present disclosure, capacitance of the first clamp capacitor is equal to capacitance of the second clamp capacitor, and capacitance of the first capacitor, capacitance of the second capacitor, and capacitance of the third capacitor are equal.

In an embodiment of the present disclosure, each MFU further includes a differential-voltage MUX. A first input end and a second input end of the differential-voltage MUX are connected to the differential voltage ends of each MFU, respectively. The latching circuit includes a latch controlling switch a first inverter, and a second inverter connected in series, and the first inverter and the second inverter connected in series are connected in parallel to a latch starting switch. An output end of the second inverter in the latching circuit is connected to a third input end of the differential-voltage MUX. A selection switch is connected between the output end of the differential-voltage MUX and the first plate of the third capacitor.

The present disclosure further provides a control method of CIM circuit based on charge redistribution, and the control method is applied in the CIM circuit based on charge redistribution above. The control method includes: representing each x-bit signed weight W as a difference of two (x−1)-bit unsigned weights: $W=WP[(x-2):0]-WN[(x-2):0]$, wherein $WP[(x-2):0]$ and $WN[(x-2):0]$ represent two (x−1)-bit unsigned numbers, and represent a first unsigned weight and a second unsigned weight, respectively; forming bit-based differential pairs each including $WP[(k)]$ and $WN[(k)]$ by a first unsigned weight and a second unsigned weight, wherein k represents a bit number, $0 \leq k \leq x-2$; storing the bit-based differential pairs corresponding to the signed weight in the memory cell pairs of the corresponding memory cell row sequentially, starting from a first memory cell pair and based on bit numbers from a high bit to a low bit.

The CIM circuit based on charge redistribution and the control method thereof in the present disclosure can realize the vector matrix multiplication based on charge redistribution, and there are no direct currents but only a charge transfer process in the entire calculation process, which greatly reduces power consumption of calculation. The CIM circuit based on charge redistribution of the present disclosure, by means of the memory array, the plurality of MFUs, the plurality of MUXs and the WL driver, can realize clamping, a subtraction between a column pair, an analog shift and addition, and an analog-to-digital conversion. Compared with circuits that independently implement the above functions respectively, the present invention can reduce the area of the computing system.

BRIEF DESCRIPTION OF THE DRAWINGS

FIGS. 9a-9d show schematic views of an MFU of a CIM circuit based on charge redistribution and a working process thereof according to yet another embodiment of the present disclosure; and FIG. 10 is a flow chart of a control method of a CIM circuit based on charge redistribution according to an embodiment of the present disclosure.

DETAILED DESCRIPTION OF THE EMBODIMENTS

In order to make the purposes, technical solutions and advantages of the embodiments of the present disclosure clearer, the technical solutions of the embodiments of the present disclosure will be described clearly and completely hereinafter with reference to the drawings of the embodiments of the present disclosure. Obviously, the described embodiments are part of the embodiments of the disclosure, rather than all embodiments. Based on the embodiments in the disclosure, all other embodiments obtained by those of ordinary skill in the art without involving creative work fall within the scope of protection of the disclosure.

Figure 1:
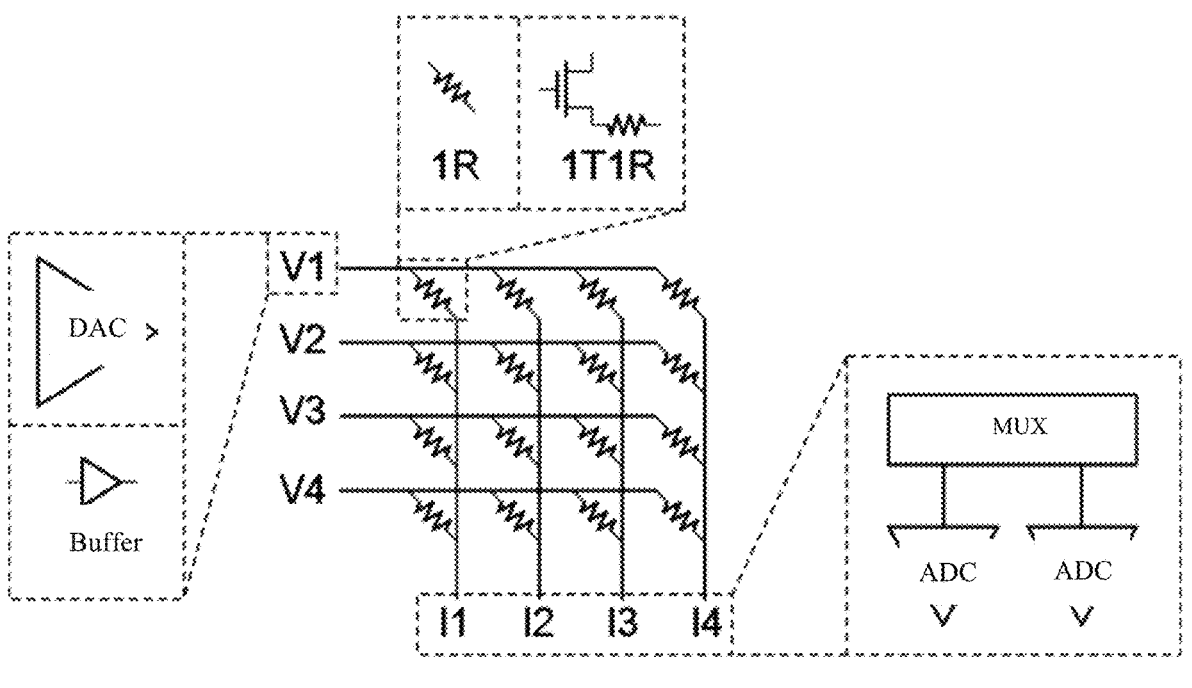
FIG. 1 is a schematic view of a CIM circuit based on memory array in the prior art.

FIG. 1 is a schematic view of a CIM circuit based on memory array in the prior art. After weights are written in Non-volatile memory cells such as RRAM, PCRAM, MRAM, FeRAM, or FeFET, etc., the weights are stored in conductivities of the memory cells, respectively. The memory cells are arranged in an array, and the voltage inputted to one end is used as the input of the vector matrix multiplication. Calculations are performed by the memory array based on Ohm's law and Kirchhoff's law, and the voltage or current outputted from another end of the memory array is a result of a sum of the vector matrix multiplications.

The memory cells in the memory array each may be a 1R (including one resistor) memory cell or a 1T1R (including one transistor and one resistor) memory cell. The inputs of the memory array may be multi-valued voltages inputted from DACs, or may be binary voltages inputted from buffers. A result of a sum is usually read out by an analog-to-digital converter (ADC). Since the area of the analog-to-digital converter does not match the area of the memory cell, a multiplexer (MUX) is usually used to allow multiple columns of the memory array to share an ADC. Since 1T1R memory cells can avoid the problem of write crosstalk, 1T1R memory cells are usually used in a relatively large memory array. In a conventional naming manner, the line connected to a gate of a transistor is called a word line (WL), the line connected to a source of a transistor is called a source line (SL), and the line connected to a drain of a transistor is called a bit line (BL).

Figure 2A:
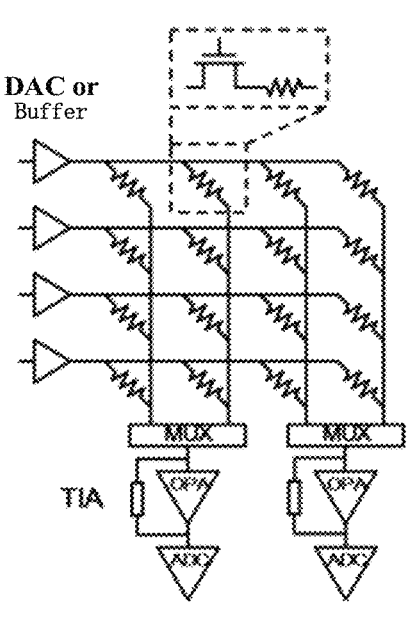
FIGS. 2a-2b show schematic views of two CIM circuits each using a 1T1R (including one transistor and one resistor) memory array in the prior art.
Figure 2B:
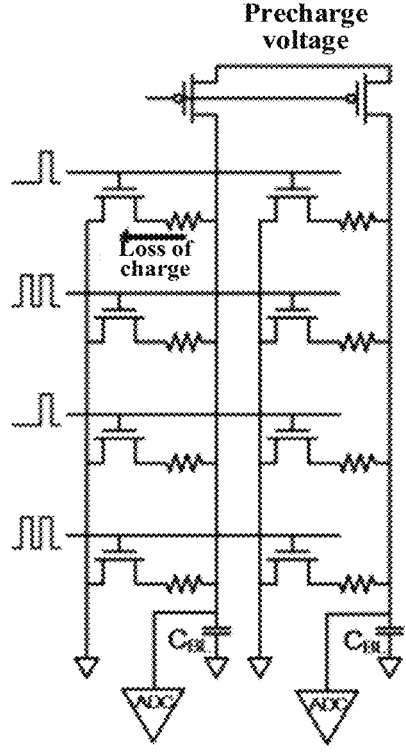

FIGS. 2*a*-2*b* show schematic views of two CIM circuits each using a 1T1R (including one transistor and one resistor) memory array in the prior art. As showing in FIG. 2(*a*), the inputs are multi-valued voltages from the DACs or binary voltages from the buffers, and the outputs are clamping BL-voltages of operational amplifiers. After currents through the bit lines in a column are summed according to Kirchhoff's law, the total current is converted into a voltage by a trans-impedance amplifier (TIA) including an operational amplifier and a resistor, and is finally read out through the ADC. In FIG. 2(*b*), a parasitic capacitor $C_{BL}$ on the BL is first charged to a fixed voltage, then the SL is grounded, and an input pulse is applied to the WL. The lost charge of the parasitic capacitor $C_{BL}$ on the BL is equal to the sum of the charge flowing through each memory cell on the corresponding BL, so the voltage drop in the bit line is equal to the inputs multiplied by the weights, and is the result of the vector matrix multiplication, and finally this voltage drop is read out through the ADC.

However, the CIM circuit in the prior art has the following problems: In FIG. 2(*a*), due to a direct current (DC) process, there is a relatively large current in the array and the operational amplifier, which affects further improvement of the energy efficiency of the system. In FIG. 2(*b*), there are no DC processes, so a relative high energy efficiency may be achieved. However, the parasitic capacitor $C_{BL}$ on the BL is usually small, and the number of memory cell rows turned on at the same time is relatively small, which will affect a degree of parallelism of calculation and increase the number of times the ADC operates. What's more, due to the small parasitic capacitor on the BL, the voltage on the bit line cannot be stable under different products of the inputs and the weights, so the result of calculation is nonlinear. Finally, in FIG. 2(*b*), as only a binary voltage can be inputted into the gate of the transistor, the inputting cannot be completed efficiently by means of inputting multi-valued voltages.

Figure 3:
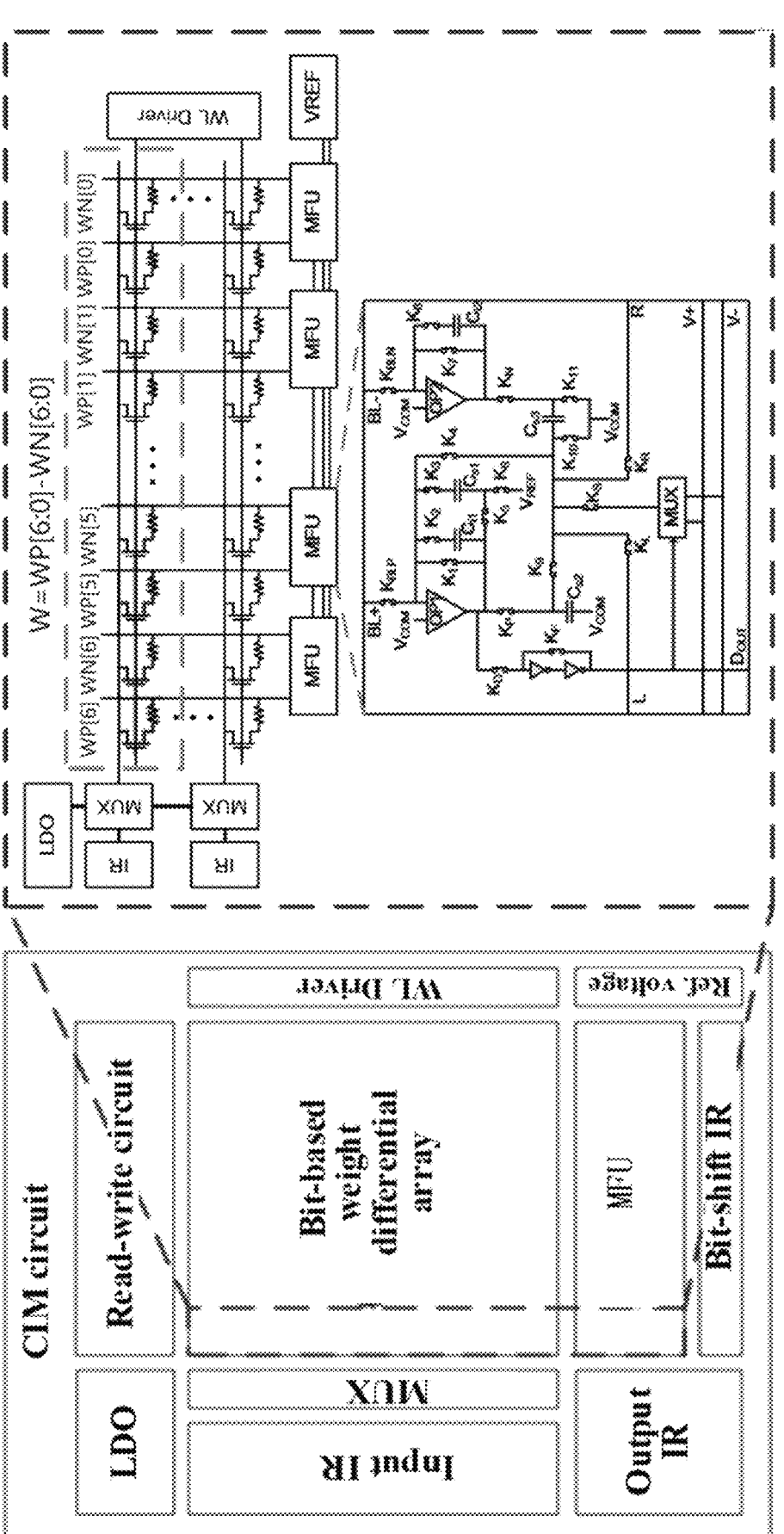
FIG. 3 is a schematic view of a CIM circuit based on charge redistribution according to an embodiment of the present disclosure.

In view of the existing problems in the prior art, an embodiment of the present disclosure provides a CIM circuit based on charge redistribution. As shown in FIG. 3, the CIM circuit based on charge redistribution includes a memory array, a plurality of multiple-functional output units (MFUs), a plurality of MUXs, and a WL driver. The memory array includes multiple memory cell rows and multiple memory cell columns. Each memory cell row includes multiple memory cells, and each memory cell column includes multiple memory cells. Starting from the first memory cell in each memory cell row, every two adjacent memory cells form a memory cell pair in sequence. Starting from the first memory cell column in the memory array, every two adjacent memory cell columns form a memory cell column pair in sequence. A grounded register capacitor $C_{SL}$ is connected to the SL of each memory cell row. Input ends of each of the plurality of MFUs are connected correspondingly to a first bit line BL+ and a second bit line BL– of each memory cell column pair. Each of the MUXs includes multiple voltage-input ends and an output end, and the output end of each of the MUXs is connected to the SL of each memory cell row in a one-to-one correspondence. The output end of the WL driver is connected to the WL of each memory cell row.

The memory array of the present disclosure includes m rows and n columns of memory cells. The m rows and n columns of memory cells are divided into m memory cell rows and n memory cell columns. Each memory cell row includes n memory cells arranged horizontally in sequence. Each memory cell column includes m memory cells arranged vertically in sequence. In each memory cell row, starting from the first memory cell, each two adjacent memory cells form a memory cell pair in sequence. In each memory cell row, the memory cell pairs, starting from the first memory cell pair, are configured to store bit-based differential pairs each corresponding to a signed weight in an order of bit numbers from a high bit to a low bit. The bit lines of the memory cells in each memory cell column pair include the first bit line BL+ and the second bit line BL–, and are connected to a corresponding MFU. Word lines of the memory cell rows of the memory array are connected to the same WL driver. The WL driver is arranged to control the memory cells in the memory array to be turned on or off, for example, control the gate of the transistor of each memory cell to be turned on or off. The CIM circuit based on charge redistribution of the present disclosure realizes the vector matrix multiplication based on charge redistribution, and there are no direct currents but only a charge transfer process in the entire calculation process, which greatly reduces power consumption of calculation. The CIM circuit based on charge redistribution of the present disclosure, by means of the memory array, the plurality of MFUs, the plurality of MUXs and the WL driver, can realize clamping, a subtraction between a column pair, an analog shift and addition, and an analog-to-digital conversion. Compared with circuits that independently implement the above functions respectively, the present invention can reduce the area of the computing system.

The principle of compute-in-memory based on charge redistribution will be further described in this disclosure. In an embodiment of the present disclosure, each x-bit signed weight W is represented as a difference of two (x–1)-bit unsigned weights: W=WP[(x–2):0]–WN[(x–2):0], where WP[(x–2):0] and WN[(x–2):0] represent two (x–1)-bit unsigned numbers, and represent a first unsigned weight and a second unsigned weight, respectively. The bit-based differential pairs each including WP[(k)] and WN[(k)] are formed by the first unsigned weight and the second unsigned weight, where k represents a bit number, and includes the numbers satisfying 0≤k≤x–2. The bit-based differential pairs corresponding to the signed weight are sequentially stored in the memory cell pairs of the corresponding memory cell row, starting from the first memory cell pair and based on the bit numbers from a high bit to a low bit. Each bit-based differential pair of the weight is stored in a memory cell pair. For the x-bit signed weight W, the (x–1) pairs of unsigned weights, namely the (x–1) bit-based differential pairs, are stored in (x–1) consecutive memory cell pairs, that is, stored in 2(x–1) memory cells, starting from the first memory cell pair in the memory cell row and based on the bit numbers from the high bit to the low bit. Each memory cell column pair has two BLs (BL+ and BL–) connected to an MFU. For each memory cell row storing the (x−1) pairs of unsigned weights corresponding to the x-bit signed weight W, at least (x−1) MFUs are arranged. One end of the SL of each memory cell row in the memory array is connected to a MUX. The MUX is configured to select one of the multi-valued voltages to be inputted to the SL of the memory cell row. The SL has a grounded parasitic capacitor $C_{SL}$. The charge stored in the grounded parasitic capacitor $C_{SL}$ is proportional to the input voltage applied to the SL corresponding to the memory cell row.

An embodiment of the present disclosure is described by taking an 8-bit signed weight as an example. As shown in FIG. 3, the 8-bit signed weight is represented by the subtraction of two 7-bit unsigned weights: W=WP[6:0]−WN[6: 0], where WP[6:0] and WN[6:0] are the two 7-bit unsigned numbers, representing the first unsigned weight and the second unsigned weight, respectively. In the memory array, the high-bits WP[6] and WN[6] form a high-bit differential pair, which is stored in the first memory cell pair in the memory cell row. WP[5] and WN[5] form a relatively low-bit differential pair, and are stored in the second memory cell pair in the memory cell row, and like this, WP[0] and WN[0] form a lowest-bit difference pair, and are stored in the seventh memory pair in the memory cell row. The 8-bit signed weight W is divided into seven bit-based differential pairs, and is stored in fourteen consecutive memory cells, namely, in seven memory cell pairs in a memory cell row. One MFU is arranged for one bit-based differential pair. Assume that N weights are stored in one memory cell row of the memory array, then the number of memory cell columns is 14N columns, and 7N MFUs need to be arranged. Assume that the memory array has m rows of memory cell rows, then the memory array may store N×m weights.

Figure 4:
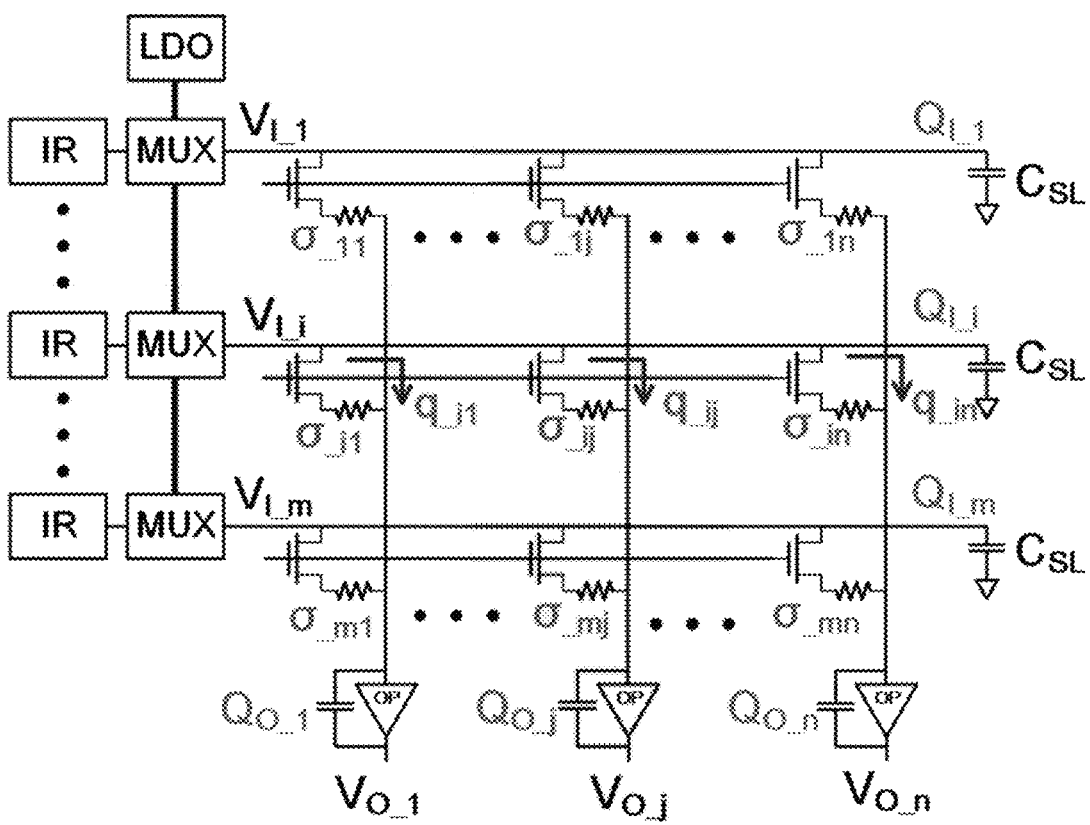
FIG. 4 is a schematic view showing a principle of realizing a vector matrix multiplication based on charge redistribution according to an embodiment of the present disclosure.

The principle of the CIM circuit based on charge redistribution of the present disclosure will be specifically described. Referring to FIG. 4, the vector matrix multiplication is implemented in the m×n memory array. First, a low dropout regulator (LDO) generates the required multi-valued input voltages, and the MUX selects one voltage from multi-valued input voltages based on a value in an input register (IR), and inputs and applies the voltage to the SL of the corresponding memory cell row of the input array. A grounded parasitic capacitor $C_{SL}$ exists in the SL of the memory cell row. The conductance $\sigma_{\_ij}$ corresponding to the resistor of any memory cell in the memory array is used configured to store the weight for the vector matrix multiplication, and a total sum of conductances of all rows is $\Sigma_j \sigma_{\_ij}$. The charge $Q_{I\_i}$ stored in the parasitic capacitor $C_{SL}$ of the i-th SL is proportional to the input voltage $V_{I\_i}$ of the corresponding row. During a charge redistribution, all memory cells, namely the gates of the transistors in the memory array, are turned on. The charge flowing through any memory cell in the memory array is $q_{\_ij}$:

$$q_{\_ij} = Q_{I\_i} \times \frac{\sigma_{\_ij}}{\sum_j \sigma_{\_ij}} \tag{1}$$

After the charge is redistributed, the BL at the bottom of the j-th memory cell column is connected to the operational amplifier of the MFU, and the charge in the feedback capacitor of the operational amplifier is $Q_{O\_j}$ $$Q_{O\_j} = \sum_i q_{\_ij} \tag{2}$$

Assume that the total sum of conductances of each memory cell row implementing the calculation in the memory array is the same, that is:

$$C = \sum_j \sigma_{\_ij} \tag{3}$$

The hypotheses will be proved by taking an 8-bit signed weight as an example. The 8-bit signed weight is represented by the subtraction of two 7-bit unsigned weights and is stored in fourteen memory cells in a row. Assume a total of N weights are stored in one row of the memory array, that is, the number of columns of the array is 14N columns. Then in the case that the weights are randomly distributed, the probability of not meeting a condition is $$P = \sum_{i=1}^{N/2} C_N^{2i-1} \left(\frac{7}{255}\right)^{2i-1} \left(\frac{8}{255}\right)^{N+1-2i} \tag{4}$$

It shows that with a very small probability, the total sum of conductance of a certain memory cell row does not meet the condition formula (3), and there is only an error of a difference between a high resistance and a low resistance of a memory cell, which may be negligible within a tolerance range of a neural network. Similarly, it can be proved that weights of other numbers of bits also meet the above condition formula.

After it is proved that the condition formula $C=\Sigma_j \sigma_{\_ij}$ is met, it is obtained that:

$$Q_{O\_j} = \frac{1}{c} \sum_i Q_{I\_i} \times \sigma_{\_ij} \tag{5}$$

Since the output voltage $V_{O\_j}$ of the operational amplifier in the MFU is proportional to the charge $Q_{O\_j}$ in the feedback capacitor, the vector matrix multiplication of charge redistribution is implemented.

In an embodiment of the present disclosure, the CIM circuit further includes a read-write circuit. The bit-based differential pairs corresponding to each weight to be stored in the memory array each are written into a corresponding memory cell pair in the memory array through the read-write circuit.

Figure 5:
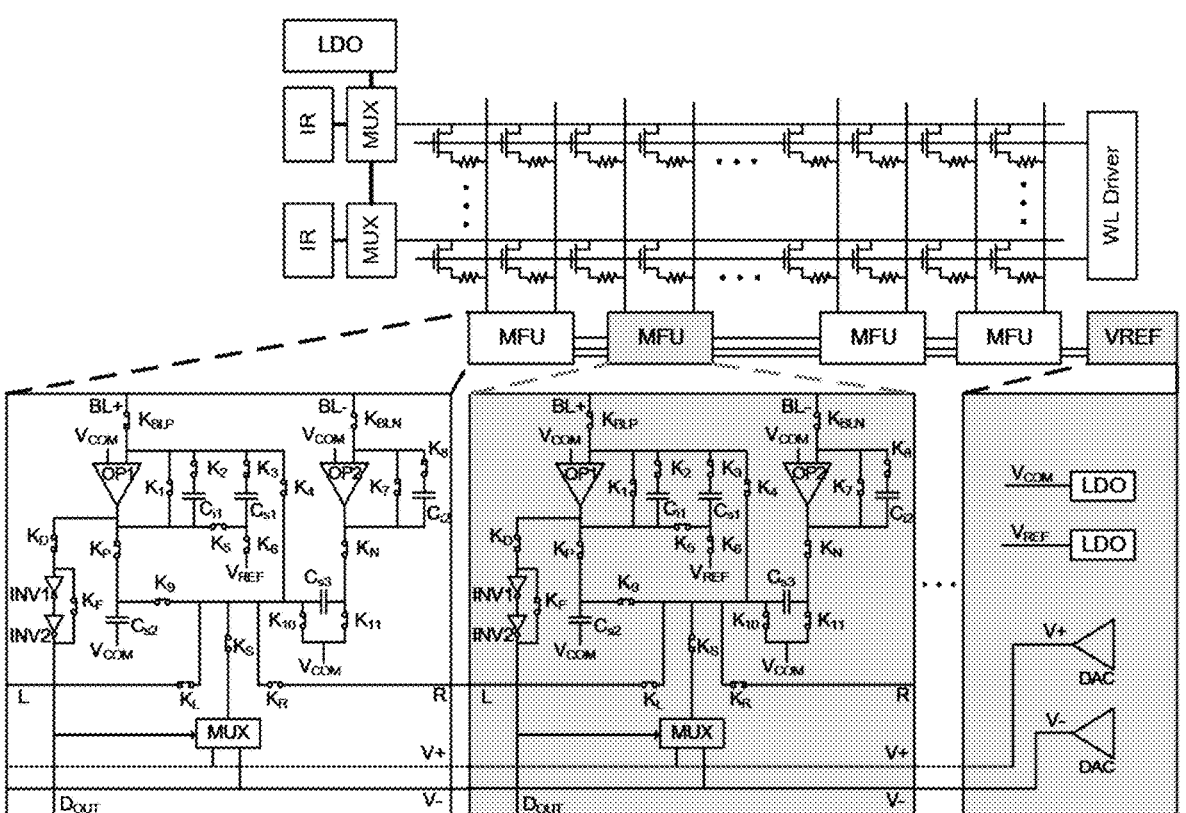
FIG. 5 is a schematic view of the CIM circuit based on charge redistribution according to another embodiment of the present disclosure.

In an implementation of the present disclosure, as shown in FIG. 3 and FIG. 5, the CIM circuit also includes a low dropout regulator LDO and an input register IR, and the multiple voltage-input ends of each of the plurality of MUXs are connected to the output ends of the low dropout regulator LDO and the output ends of the input register IR respectively. The low dropout regulator LDO is configured to generate the multi-valued input voltages, and the input register IR is configured to store the multi-valued input voltages.

In an implementation of the present disclosure, as shown in FIG. 3 and FIG. 5, the plurality of MUXs are connected in series. Each MUX is configured to select one of the multi-valued voltages to be inputted and applied to a corresponding SL of the memory array.

In an embodiment of the present disclosure, the plurality of memory cells may be RRAM, PCRAM, MRAM, FeRAM, or FeFET non-volatile memory cells.

In an embodiment of the present disclosure, as shown in FIG. 5, the CIM circuit further includes a reference voltage generator. The output ends of the reference voltage generator are connected to a common-mode voltage terminal $V_{COM}$, a reference voltage terminal $V_{REF}$ and the differential voltage ends (V+ and V−) of each of the plurality of MFUs, respectively. Further, as shown in FIG. 5, the reference voltage generator VREF includes a plurality of low dropout regulators LDO and a plurality of DACs. The output ends of the low dropout regulators LDO are connected to the common-mode voltage terminal $V_{COM}$ and the reference voltage terminal $V_{REF}$ of each of the plurality of MFUs, to generate the common mode voltage $V_{COM}$ and the reference voltage $V_{REF}$, respectively. The output ends of the DACs are connected to the differential voltage end V+ and V− of each of the plurality of MFUs, respectively, to generate the differential voltages V+ and V− of the plurality of MFUs, respectively.

Figure 6:
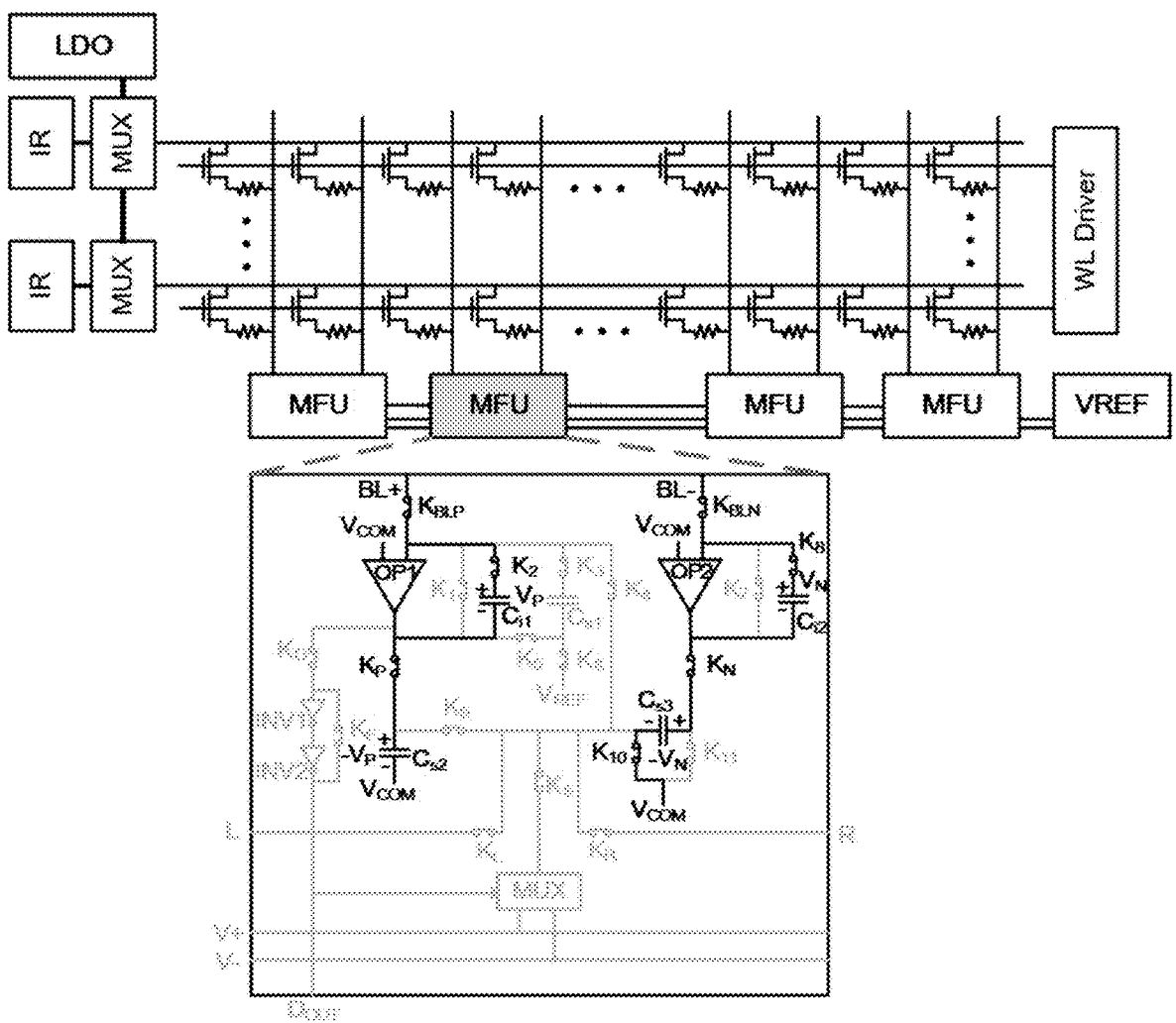
FIG. 6 is a schematic view showing a multi-functional output unit (MFU) of a CIM circuit based on charge redistribution according to an embodiment of the present disclosure.

In an embodiment of the present disclosure, as shown in FIG. 6, each MFU includes a first operational amplifier OP1 and a second operational amplifier OP2. An inverting input terminal of the first operational amplifier OP1 is connected to the first bit line BL+ of a corresponding memory cell column pair through a first bit-line switch $K_{BLP}$. The output terminal of the first operational amplifier OP1 is connected to a first output switch Kp and a second capacitor $C_{s2}$ connected sequentially in series. A second switch $K_2$ and a first clamp capacitor $C_{i1}$ are connected in series in the feedback loop of the first operational amplifier OP1. The inverting input terminal of the second operational amplifier OP2 is connected to the second bit line BL− of the corresponding memory cell column pair through a second bit-line switch $K_{BLN}$. The positive input terminal of the second operational amplifier OP2 is connected to the common-mode voltage terminal $V_{COM}$. The output terminal of the second operational amplifier OP2 is connected to a second output switch $K_N$, a third capacitor $C_{s3}$, and a tenth switch $K_{10}$ connected sequentially in series. An eighth switch $K_8$ and a second clamp capacitor $C_{i2}$ are connected in series in the feedback loop of the second operational amplifier OP2.

Further, in an embodiment of the present disclosure, as shown in FIG. 6, the positive input terminal of the first operational amplifier OP1 and the positive input terminal of the second operational amplifier OP2 are both connected to the common-mode voltage terminal $V_{COM}$. A first plate of the second capacitor $C_{s2}$ is connected to the first output switch Kp, and a second plate of the second capacitor $C_{s2}$ is connected to the common-mode voltage terminal $V_{COM}$. A second plate of the third capacitor $C_{s3}$ is connected to the second output switch $K_N$, and a first plate of the third capacitor $C_{s3}$ is connected to the common-mode voltage terminal $V_{COM}$ through the tenth switch $K_{10}$.

The above MFU can realize clamping the BL voltage. Referring to FIG. 6, in the process of clamping the BL voltages, the BL voltages keep stable during the vector matrix multiplication, so that the result of the charge redistribution is converted into the output voltage of the first operational amplifier OP1 and the output voltage of the second operational amplifier OP2. The first bit-line switch $K_{BLP}$ and the second bit-line switch $K_{BLN}$ are turned on to connect the first operational amplifier OP1 and the second operational amplifier OP2 in the MFU to the first bit line BL+ and the second bit line BL− of the memory cell column pair, respectively. The second switch $K_2$ in the feedback loop and the first output switch Kp connected to the output end of the first operational amplifier OP1 are turned on, and the eighth switch $K_8$ in the feedback loop and the second output switch $K_N$ connected to the output end of the second operational amplifier OP2 are turned on. In this case, the BL voltages of the memory cell column pair are clamped at $V_{COM}$. After the charge redistribution process of the bit-based weight differential array, the outputted charge from the two memory cell columns of the memory cell column pair is stored in the first clamp capacitor $C_{i1}$ and in the second clamp capacitor $C_{i2}$, respectively. The output voltage $-V_P$ of the first operational amplifier OP1 and the output voltage $-V_N$ of the second operational amplifier OP2 are proportional to the charge in the first clamp capacitor $C_{i1}$ and second clamp capacitor $C_{i2}$ respectively, and are stored in the second capacitor $C_{s2}$ and the third capacitor $C_{s3}$, respectively.

In an embodiment of the present disclosure, the capacitances of the first clamp capacitor $C_{i1}$ and second clamp capacitor $C_{i2}$ are equal, and the capacitances of the second capacitor $C_{s2}$ and third capacitor $C_{s3}$ are equal.

Figure 7A:
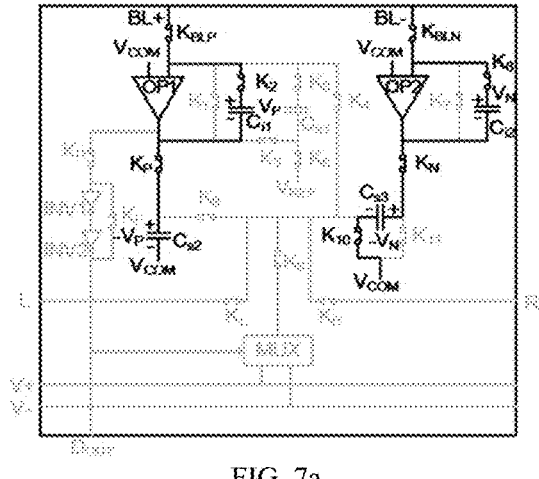
FIGS. 7a-7d show schematic views of an MFU of a CIM circuit based on charge redistribution and a working process thereof according to another embodiment of the present disclosure.
Figure 7B:
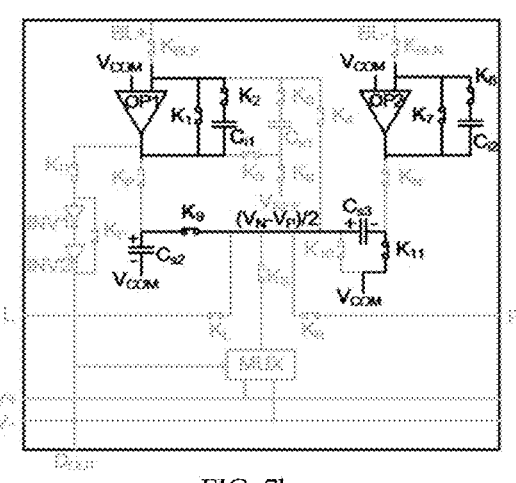
Figure 7C:
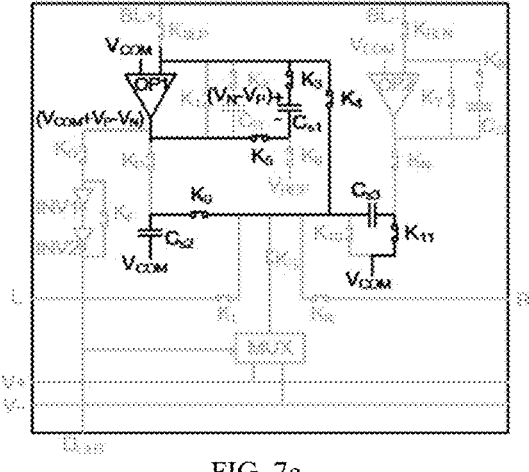

In an embodiment of the present disclosure, as shown in FIGS. 7a-7b, based on the above embodiment, the feedback loop of the first operational amplifier OP1 is connected in parallel with a first switch $K_1$ (shown in FIG. 7b), and is also connected in parallel with a third switch $K_3$, a first capacitor $C_{s1}$, and a fifth switch $K_5$ connected in series (shown in FIG. 7c). The feedback loop of the second operational amplifier OP2 is also connected in parallel with a seventh switch $K_7$ (shown in FIG. 7b). A fourth switch $K_4$ is connected between the inverting input terminal of the first operational amplifier OP1 and a first plate of the third capacitor $C_{s3}$, and a ninth switch $K_9$ is connected between the first plate of the second capacitor $C_{s2}$ and the first plate of the third capacitor $C_{s3}$ (shown in FIG. 7c). The eleventh switch K11 is connected between the second plate of the third capacitor $C_{s3}$ and the common-mode voltage terminal $V_{COM}$ (shown in FIG. 7d). Further, in an embodiment of the present disclosure, the capacitances of the first capacitor $C_{s1}$, second capacitor $C_{s2}$ and third capacitor $C_{s3}$ are equal.

Figure 7D:
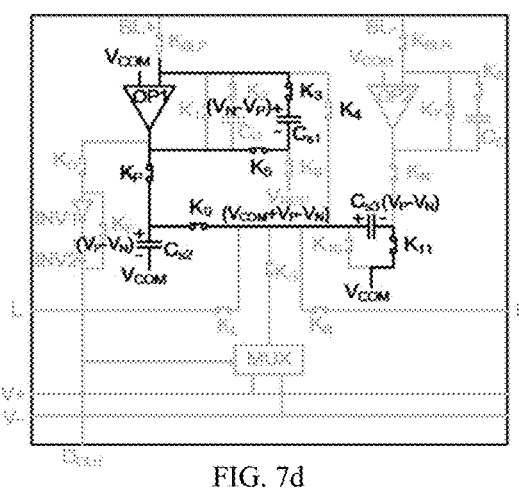

The MFU of this embodiment can implement a subtraction operation of the outputted results of two memory cell columns in one memory cell column pair. During the subtraction operation, an output voltage of one memory cell column is subtracted from an output voltage of another memory cell column in the memory cell column pair corresponding to the bit-based differential pair consisting of the first unsigned weight and the second unsigned weight, to obtain the result of the vector matrix multiplication corresponding to one bit of binary weight. Referring to FIG. 7a, after the BL voltages of the memory cell columns are clamped, the output voltage $-V_P$ of the first operational amplifier OP1 and the output voltage $-V_N$ of the second operational amplifier OP2 are stored in the second capacitor $C_{s2}$ and in the third capacitor $C_{s3}$, respectively. Referring to FIG. 7b, the first bit-line switch $K_{BLP}$ and the second bit-line switch $K_{BLN}$ are turned off to disconnect the first operational amplifier OP1 and the second operational amplifier OP2 from the BLs of memory array, respectively, and the first output switch Kp and the second output switch $K_N$ are turned off and then the short-circuit switches namely the first switch $K_1$ and the seventh switch $K_7$ are turned on, so that the charge in the first clamp capacitor $C_{i1}$ and the charge in the second clamp capacitor $C_{i2}$ are cleared. At the same time, the tenth switch $K_{10}$ is turned off, and the ninth switch $K_9$ and the eleventh switch $K_{11}$ are turned on, so that the charge in the second capacitor $C_{s2}$ and the charge in the third capacitor $C_{s3}$ are averaged, and so that the voltage across the second capacitor $C_{s2}$ and the voltage across the third capacitor $C_{s3}$ voltage become $(V_N-V_P)/2$. Referring to FIG. 7c, the third switch $K_3$ and the fourth switch $K_4$ are turned on, so that the charge in the second capacitor $C_{s2}$ and the charge in the third capacitor $C_{s3}$ are transferred to the first capacitor $C_{s1}$. Since the capacitances of the first capacitor $C_{s1}$, second capacitor $C_{s2}$ and third capacitor $C_{s3}$ are equal, the voltage across the first capacitor $C_{s1}$ is $(V_N-V_P)$, and the output voltage of the first operational amplifier OP1 is $(V_{COM}+V_P-V_N)$. Referring to FIG. 7d, the fourth switch $K_4$ is turned off, and the first output switch $K_P$ is turned on, then the voltage on the first plate of the second capacitor $C_{s2}$ and the voltage on the first plate of the third capacitor $C_{s3}$ are $(V_{COM}+V_P-V_N)$, and the second plate of the second capacitor $C_{s2}$ and the second plate of the third capacitor $C_{s3}$ are connected to the common-mode voltage terminal $V_{COM}$, and the voltages across these two capacitors are both $(V_P-V_N)$. Thus, the MFU realizes the function of performing the subtraction operation on the results output by the two memory cell columns in the memory cell column pair.

Figures 8A, 8B, 8C, 8D:
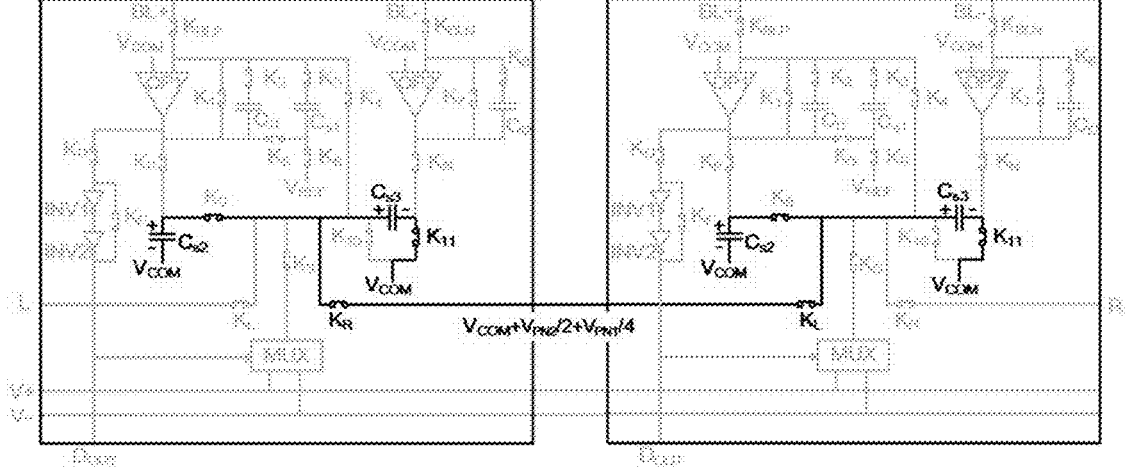
FIGS. 8a-8d show schematic views of an MFU of a CIM circuit based on charge redistribution and a working process thereof according to yet another embodiment of the present disclosure.

In an embodiment of the present disclosure, as shown in FIGS. 8a-8d, based on the above embodiment, the first plate of the third capacitor $C_{s3}$ of the MFU is connected to a first terminal of a first shift switch $K_L$ and a first terminal of a second shift switch $K_R$ (shown in FIG. 8d). In each two adjacent MFUs, a second terminal of the second shift switch $K_R$ in the MFU connected to the front memory cell column pair is connected to a second terminal of the first shift switch $K_L$ in the MFU connected to the back memory cell column pair (shown in FIG. 8d).

The MFU of this embodiment can implement an operation of analog shift and addition. In this process, as shown in FIGS. 8a-8d, the MFU can implement the weighted addition of the results of the vector matrix multiplication of multiple bits of binary weights, to obtain the total result of the vector matrix multiplication, which is represented as the voltage across the second capacitor $C_{s2}$ and third capacitor $C_{s3}$. Referring to FIG. 8a, after the subtraction operation is performed on the output results of the two memory cell columns in the memory cell column pair, the ninth switch $K_9$ is turned off and the tenth switch $K_{10}$ is turned on, so that the charge in the third capacitor $C_{s3}$ is cleared, and the charge in the second capacitor $C_{s2}$ keeps unchanged. Referring to FIG. 8b, the tenth switch $K_{10}$ is turned off and the ninth switch $K_9$ is turned on. At this time, the charge in the second capacitor $C_{s2}$ and the charge in the third capacitor $C_{s3}$ are averaged, so that the voltage on the first plate of the second capacitor $C_{s2}$ and the voltage on the first plate of the third capacitor $C_{s3}$ are $V_{COM}+(V_P-V_N)/2$. Referring to FIG. 8(c), among the two adjacent MFUs, the next MFU arranged at the right side of the figure performs the above operations so that the voltage on the first plate of the second capacitor $C_{s2}$ and the voltage on the first plate of the third capacitor $C_{s3}$ is $V_{COM}+V_{PN1}/2$, representing a low-bit binary numbers that need to be shifted and added. In the previous MFU arranged at the left side of the figure, the voltage on the first plate of the second capacitor $C_{s2}$ and the voltage on the first plate of the third capacitor $C_{s3}$ are $(V_{COM}+V_{PN2})$ and keep unchanged, and represent the high-bit binary numbers that need to be shifted and added. Referring to FIG. 8d, the second shift switch $K_R$ in the MFU arranged at the left side and the first shift switch $K_L$ in the MFU arranged at the right side are turned on, so that the charge in the first plates of the second capacitor $C_{s2}$ and third capacitor $C_{s3}$ in the two MFUs are averaged, and the voltages across the second capacitor $C_{s2}$ and third capacitor $C_{s3}$ are both $(V_{COM}+V_{PN2}/2+V_{PN1}/4)$. This process is performed in sequence from back to front, that is, from right to left in the figure, thereby realizing the function of performing the shift and addition of the analogy results of calculation.

In an embodiment of the present disclosure, as shown in FIGS. 9a-9d, based on the above embodiment, each MFU further includes a latching circuit, and the output end of the first operational amplifier OP1 is connected to the latching circuit. The third switch $K_3$, the first capacitor $C_{s1}$ and the fifth switch $K_5$ are connected in series between the inverting input terminal and the output end of the first operational amplifier OP1, and one end of the sixth switch $K_6$ is connected between the first capacitor $C_{s1}$ and the fifth switch $K_5$, and the other end of the sixth switch $K_6$ is connected to the reference voltage terminal $V_{REF}$.

Further, in an embodiment of the present disclosure, each MFU further includes a differential-voltage MUX. The first input end and the second input end of the differential-voltage MUX are connected to the differential voltage ends (V+ and V−) of the MFU, respectively. The latching circuit includes a latch controlling switch $K_D$, a first inverter INV1 and a second inverter INV2 which are connected in series. The first inverter INV1 and the second inverter INV2 connected in series are connected in parallel to a latch starting switch $K_F$. The output end of the second inverter INV2 in the latching circuit is connected to a third input end of the differential-voltage MUX. A selection switch Ks is connected between the output end of the differential-voltage MUX and the first plate of the third capacitor $C_{s3}$.

In this embodiment of the present disclosure, the MFU can implement an analog-to-digital conversion function of converting the result of the vector matrix multiplication, which is represented by voltage, into a digital quantity as the final output of the CIM circuit. Referring to FIG. 9a, after the charge in the second capacitor $C_{s2}$ and third capacitor $C_{s3}$ is transferred to the first capacitor $C_{s1}$, the voltage to be measured across the first capacitor $C_{s1}$ is Vx. The feedback loop of the first operational amplifier OP1 is disconnected, and the sixth switch $K_6$ is turned on, and the second plate of the first capacitor $C_{s1}$ is connected to the reference voltage $V_{REF}$. Thus, the first operational amplifier OP1 is used as a comparator and compares the voltage $(V_{REF}+Vx)$ with the common-mode voltage $V_{COM}$. The latch controlling switch $K_D$ is turned on and the comparison result is converted into a digital level by the first inverter INV1 and the second inverter INV2 and then output. Referring to FIG. 9(b), the latch starting switch $K_F$ is turned on, and the latch controlling switch $K_D$ is turned off, and the comparison result is latched by the first inverter INV1 and the second inverter INV2. The differential-voltage MUX selects one from the voltages $(V_{COM}+V_d)$ and $(V_{COM}-V_d)$ based on the comparison result and stores it in the third capacitor $C_{s3}$. Since the second plate of the third capacitor $C_{s3}$ is connected to the common-mode voltage $V_{COM}$, the voltage of the first plate of the third capacitor $C_{s3}$ is $V_d$ or $-V_d$. Referring to FIG. 9c, the fourth switch $K_4$ and the fifth switch $K_5$ are turned on, and the sixth switch $K_6$ is turned off, thus the charge in the third capacitor $C_{s3}$ is transferred to the first capacitor $C_{s1}$, and the voltage across the first capacitor $C_{s1}$ becomes $(Vx\pm V_d)$. Referring to FIG. 9(d), the feedback loop of the first operational amplifier OP1 is re-disconnected, and the first operational amplifier OP1 is used as a comparator to compare the voltage $(V_{REF}+Vx\pm V_d)$ with the common-mode voltage $V_{COM}$, and a comparison result is converted into a digital level by the first inverter INV1 and the second inverter INV2 and then the digital level is outputted. Then the inputted voltages of the MUX are changed into $(V_{COM}+V_d/2)$ and $(V_{COM}-V_d/2)$, and the subsequent processes continue to be completed. In each digital-to-analog conversion, $V_d$ is divided by 2, and $V_d$, $V_d/2$, $V_d/4$, etc., are obtained.

After the above processes are performed circularly, the binary search analog-to-digital conversion function is performed.

The present disclosure also provides a control method of CIM circuit based on charge redistribution, which is applied to the above-mentioned CIM circuit based on charge redistribution of the present disclosure. As shown in FIG. 10, the control method of CIM circuit based on charge redistribution includes the following steps.

At Step S1, each x-bit signed weight W is represented as a difference of two (x–1)-bit unsigned weights: W=WP[(x–2):0]–WN[(x–2):0], where WP[(x–2):0] and WN[(x–2):0] represent two (x–1)-bit unsigned numbers, and represent a first unsigned weight and a second unsigned weight, respectively.

At Step S2, bit-based differential pairs each including WP[(k)] and WN[(k)] are formed by the first unsigned weight and the second unsigned weight, where k represents the bit number, 0≤k≤x–2.

At Step S3, the bit-based differential pairs corresponding to the signed weight are sequentially stored in the memory cell pairs of the corresponding memory cell row, starting from the first memory cell pair and based on the bit numbers from a high bit to a low bit.

The disclosed control method of CIM circuit based on charge redistribution can control the CIM circuit to realize the vector matrix multiplication based on charge redistribution. There are no direct currents but only a charge transfer process in the entire calculation process, which greatly reduces power consumption of calculation. When the control method of the CIM circuit based on charge redistribution of the present disclosure is applied in the CIM circuit based on charge redistribution, the CIM circuit, by means of the memory array, the plurality of MFUs, the plurality of MUXs and the WL driver, can realize clamping, a subtraction between a column pair, an analog shift and addition, and an analog-to-digital conversion. Compared with circuits each independently implementing the above functions, respectively, the present invention can reduce the area of the computing system.

The disclosed control method of CIM circuit based on charge redistribution controls the CIM circuit to perform calculations and controls the CIM circuit to implement different functions. For the details, please refer to the above description of controlling different circuits to perform corresponding work, and the description will not be repeated herein.

The technical features of the embodiments above may be combined arbitrarily. To make the description concise, not all possible combinations of the technical features in the above embodiments are described. However, as long as there are no contradictions in the combinations of these technical features, all of the combinations should be considered to be within the scope of the specification.

The embodiments above only represent several implementation modes of the present application, and the description thereof is relatively specific and detailed, but it should not be construed as limiting the scope of the patent. It should be noted that for those skilled in the art, various modifications and improvements may be made without departing from the concept of the present application, and all these modifications and improvements belong to the protection scope of the present application. Therefore, the scope of protection of the patent application should be subject to the appended claims.

What is claimed is:

1. A compute-in-memory (CIM) circuit based on charge redistribution, comprising:

a memory array, comprising a plurality of memory cell rows and a plurality of memory cell columns, wherein each memory cell row comprises a plurality of memory cells; each memory cell column comprises a plurality of memory cells; starting from a first memory cell in each memory cell row, every two adjacent memory cells form a memory cell pair in sequence; starting from a first memory cell column in the memory array, every two adjacent memory cell columns form a memory cell column pair in sequence; a grounded register capacitor is connected to a source line (SL) of each memory cell row;

a plurality of multiple-functional output units (MFUs), input ends of each of the plurality of MFUs being connected to a first bit line (BL) and a second BL of each memory cell column pair, respectively;

a plurality of multiplexers (MUXs), each of the plurality of MUXs comprising a plurality of voltage-input ends and an output end, and the output end of each of the MUXs being connected to the SL of each memory cell row in a one-to-one correspondence; and a word line (WL) driver, an output end of the WL driver being connected to a WL of each memory cell row, wherein the CIM circuit further comprise S reference voltage generator; output ends of the reference voltage generator are connected to a common-mode voltage terminal of each MFU, a reference voltage terminal and differential voltage ends of each MFU, respectively; and the reference voltage generator comprises a plurality of LDOs and a plurality of digital-to-analog converters (DACs); output ends of the plurality of LDOs e connected to the common-mode voltage terminal and the reference voltage terminal of each of the plurality of MFUs; and output ends of the plurality of DACs are connected to the differential voltage ends of each of the plurality of MFUs, respectively.

2. The CIM circuit based on charge redistribution according to claim 1, further comprising a low dropout regulator (LDO) and an input register, wherein the plurality of voltage-input ends of each of the plurality of MUXs are connected to output ends of the LDO and output ends of the input register respectively.

3. The CIM circuit based on charge redistribution according to claim 1, wherein the plurality of MUXs are connected in series.

4. The CIM circuit based on charge redistribution according to claim 1, wherein the plurality of memory cells are RRAM, PCRAM, MRAM, FeRAM, or FeFET non-volatile memory cells.

5. A compute-in-memory (CIM) circuit based on charge redistribution, comprising:

a memory array comprising a plurality of memory cell rows and a plurality of memory cell columns, wherein each memory cell row comprises a plurality of memory cells; each memory cell column comprises a plurality of memory cells; starting from a first memory cell in each memory cell row, every two adjacent memory cells form a memory cell pair in sequence; starting from a first memory cell column in the memory array, every two adjacent memory cell columns form a memory cell column pair in sequence; a grounded register capacitor is connected to a source line (SL) of each memory cell row;

a plurality of multiple functional output units (MFUS), input ends of each of the plurality of MFUs being connected to a first bit line (BL) and a second BL of each memory cell column pair, respectively;

a plurality of multiplexers (MUXs), each of the plurality of MUXs comprising a plurality of voltage-input ends and an output end, and the output end of each of the MUXs being connected to the SL of each memory cell row in a one-to-one correspondence; and a word line (WL) driver, an output end of the WI driver being connected to a WL of each memory cell row;

wherein each of the plurality of MFUs comprises a first operational amplifier and a second operational amplifier;

an inverting input terminal of the first operational amplifier is connected to the first BL of a corresponding memory cell column pair through a first bit-line switch; an output terminal of the first operational amplifier is connected to a first output switch and a second capacitor connected in series; a second switch and a first clamp capacitor are connected in series in a feedback loop of the first operational amplifier;

an inverting input terminal of the second operational amplifier is connected to the second BL of the corresponding memory cell column pair through a second bit-line switch; a positive input terminal of the second operational amplifier is connected to a common-mode voltage terminal; an output terminal of the second operational amplifier is connected to a second output switch, a third capacitor, and a tenth switch connected in sequence in series; and an eighth switch and a second clamp capacitor are connected in series in a feedback loop of the second operational amplifier.

6. The CIM circuit based on charge redistribution according to claim 5, wherein:

a positive input terminal of the first operational amplifier and the positive input terminal of the second operational amplifier are both connected to the common-mode voltage terminal;

a first plate of the second capacitor is connected to the first output switch, and a second plate of the second capacitor is connected to the common-mode voltage terminal;

a second plate of the third capacitor is connected to the second output switch, and a first plate of the third capacitor is connected to the common-mode voltage terminal through the tenth switch.

7. The CIM circuit based on charge redistribution according to claim 5, wherein: capacitance of the first clamp capacitor is equal to capacitance of the second clamp capacitor, and capacitance of the second capacitor is equal to capacitance of the third capacitor.

8. The CIM circuit based on charge redistribution according to claim 6, wherein:

the feedback loop of the first operational amplifier is connected in parallel with a first switch, and further connected in parallel with a third switch, a first capacitor, and a fifth switch connected in series;

the feedback loop of the second operational amplifier is further connected in parallel with a seventh switch;

a fourth switch is connected between the inverting input terminal of the first operational amplifier and the first plate of the third capacitor;

a ninth switch is connected between the first plate of the second capacitor and the first plate of the third capacitor; and an eleventh switch is connected between the second plate of the third capacitor and the common-mode voltage terminal.

9. The CIM circuit based on charge redistribution according to claim 8, wherein:

the first plate of the third capacitor of each MFU is connected to a first terminal of a first shift switch and a first terminal of a second shift switch;

in each two adjacent MFUs, a second terminal of a second shift switch in an MFU connected to a front memory cell column pair is connected to a second terminal of a first shift switch in an MFU connected to a back memory cell column pair.

10. The CIM circuit based on charge redistribution according to claim 8, wherein:

capacitance of the first clamp capacitor is equal to capacitance of the second clamp capacitor, and capacitance of the first capacitor, capacitance of the second capacitor, and capacitance of the third capacitor are equal.

11. The CIM circuit based on charge redistribution according to claim 9, wherein:

each of the plurality of MFUs further comprises a latching circuit, and the output end of the first operational amplifier is connected to the latching circuit;

a third switch, a first capacitor and a fifth switch are connected in series between the inverting input terminal and the output end of the first operational amplifier, and one end of a sixth switch is connected between the first capacitor and the fifth switch, and another end of the sixth switch is connected to a reference voltage terminal.

12. The CIM circuit based on charge redistribution according to claim 11, wherein:

each MFU further comprises a differential-voltage MUX;

a first input end and a second input end of the differential-voltage MUX are connected to differential voltage ends of each MFU, respectively;

the latching circuit comprises a latch controlling switch, a first inverter, and a second inverter connected in series, and the first inverter and the second inverter connected in series are connected in parallel to a latch starting switch;

an output end of the second inverter in the latching circuit is connected to a third input end of the differential-voltage MUX;

a selection switch is connected between the output end of the differential-voltage MUX and the first plate of the third capacitor.

13. A control method of compute-in-memory (CIM) circuit based on charge redistribution, applied in the CIM circuit based on charge redistribution comprising:

a memory array, comprising a plurality of memory cell rows and a plurality of memory cell columns, wherein each memory cell row comprises a plurality of memory cells; each memory cell column comprises a plurality of memory cells; starting from a first memory cell in each memory cell row, every two adjacent memory cells form a memory cell pair in sequence; starting from a first memory cell column in the memory array, every two adjacent memory cell columns form a memory cell column pair in sequence; a grounded register capacitor is connected to a source line (SL) of each memory cell row, a plurality of multiple functional output units (MFUs), input ends of each of the plurality of MFUs being connected first bit line (BL) and a second BL of each memory cell column pair respectively;

a plurality of multiplexers (MUXs), each of the plurality of MUXs comprising a plurality of voltage-input ends and an output end, and the output end of each of the MUXs being connected to the SL of each memory cell row in a one-to-one correspondence; and a word line (WL) driver, an output end of the WL driver being connected to a WL of each memory cell row;

wherein the control method comprises:

representing each x-bit signed weight W as a difference of two (x−1)-bit unsigned weights: W=WP[(x−2):0]−WN[(x−2):0], wherein WP[(x−2):0] and WN[(x−2):0] represent two (x−1)-bit unsigned numbers, and represent a first unsigned weight and a second unsigned weight, respectively;

forming bit-based differential pairs each comprising WP[(k)] and WN[(k)] by a first unsigned weight and a second unsigned weight, wherein k represents a bit number, 0≤k≤x−2;

storing the bit-based differential pairs corresponding to the signed weight in the memory cell pairs of the corresponding memory cell row sequentially, starting from a first memory cell pair and based on bit numbers from a high bit to a low bit.

\* \* \* \* \*

18